(12) United States Patent
Tu et al.

(10) Patent No.: US 6,528,366 B1
(45) Date of Patent: Mar. 4, 2003

(54) FABRICATION METHODS OF VERTICAL METAL-INSULATOR-METAL (MIM) CAPACITOR FOR ADVANCED EMBEDDED DRAM APPLICATIONS

(75) Inventors: Yeur-Luen Tu, Taichung (TW); Dah Lin, Hsinchu (TW); Min-Hwa Chi, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/839,964

(22) Filed: Apr. 23, 2001

(51) Int. Cl.[7] .......................................... H01L 21/8242
(52) U.S. Cl. ...................... 438/253; 438/239; 438/243; 438/244; 438/245; 438/386; 438/396; 438/241; 438/399; 438/675; 438/639; 438/238; 438/256
(58) Field of Search ................................ 438/253, 239, 438/243, 244, 245, 386, 396, 241, 399, 675, 639, 238, 256

(56) References Cited

U.S. PATENT DOCUMENTS

| | | | |
|---|---|---|---|
| 5,918,120 A | 6/1999 | Huang | 438/239 |
| 5,998,264 A | 12/1999 | Wu | 438/260 |
| 6,117,725 A | 9/2000 | Huang | 438/241 |
| 6,271,084 B1 * | 8/2001 | Tu et al. | 438/253 |

OTHER PUBLICATIONS

"High Performance MIM Capacitor for RF BiCMOS/CMOS LSIs", by T. Yoshitomi et al., *IEEE Bipolar/BiCMOS Circuits and Technology Meetings*, paper #8.2, p. 133, 1999.
"SOI CMOS With High–Performance Passive Components for Analog, RF, and Mixed–Signal Design",by M.Staber et al., *Proceeding 1998 IEEE Int'l SOI Conf.*, p. 99–100, 1998.
"Integrated RF and Microwave Components in BiCMPS Technology", J.N. Burghartz et al., *IEEE Trans. on Electron Devices*, v. 43, No. 9, pp. 1559–1570, 1996.
"Highly Reliable MIM Capacitor Tech. Using Low Pressure CVD –WN Cylinder Storage–Node for 0.12$\mu$m–scale Embedded DRAM," S. Kamiyama et al., *Symp. on VLSI Tech.*, paper #4A–4, pp. 39–40, 1999.
"A DRAM Tech. Using MIM BST Capacitor for 0.15$\mu$m DRAM Generation and Beyond", K. Kim et al., *Symposium on VLSI Tech.*, paper #4A.1, pp. 33–34, 1999.
"Shared Tungsten Structures for FEOL/BEOL Compatibility in Logic–Friendly Merged DRAM," J.M. Drgnan et al., IEDM 1998, pp. 31.6.1–4.
"Merged DRAM–Logic in the Year 2001", by P.W. Diodato et al., *IEEE Transactions*, 1998.
"A Simple Embedded DRAM Process for 0.16$\mu$m CMOS Technologies", by C.T. Liu et al., *Symposium on VLSI Technology*, 2000, pp. 60–61.

* cited by examiner

*Primary Examiner*—Olik Chaudhuri
*Assistant Examiner*—Khiem D Nguyen
(74) *Attorney, Agent, or Firm*—George O. Saile; Stephen B. Ackerman; Rosemary L. S. Pike (57) ABSTRACT

Methods for fabricating a vertical metal-insulator-metal (MIM) capacitor are described. The capacitor can be fabricated at any level of metal interconnect, depending upon the desired depth of the capacitor. No global topology variations occur at any interconnect level in these methods. The entire process temperature is limited to be low enough, less than about 450° C., so that the back-end metal interconnect is not degraded or damaged. In one method, the deep capacitor cavity can be formed by etching back-end oxide (i.e. intermetal dielectric) from near the top level of metal interconnect until reaching the via-plug at several lower metal interconnect levels. In another method, metal lines and tungsten plugs are formed in both the logic and memory areas. Then, a selective wet metal etching is performed to remove the stacked tungsten plugs and metal lines for the formation of the capacitor cavity. After the capacitor cavity is formed by either method, the sidewall of the deep cavity is coated sequentially with a conformal conducting film as the bottom electrode and a high-k dielectric, and then filled with a conducting material to form the top electrode.

50 Claims, 6 Drawing Sheets

FABRICATION METHODS OF VERTICAL METAL-INSULATOR-METAL (MIM) CAPACITOR FOR ADVANCED EMBEDDED DRAM APPLICATIONS

BACKGROUND OF THE INVENTION (1) Field of the Invention

The present invention relates to methods of fabricating a metal-insulator-metal capacitor, and more particularly, to methods of forming vertical metal-insulator-metal capacitors for embedded DRAM applications in the fabrication of an integrated circuit device.

(2) Description of the Prior Art

Capacitors are critical components in the integrated circuit devices of today. These passive components are often to be integrated with active bipolar or MOS transistors for analog and digital circuits. Capacitors of the types: polysilicon-insulator-polysilicon (PIP), polysilicon-insulator-polycide, polysilicon-insulator-metal (MIS), and metal-insulator-metal (MIM) capacitors have been used in the art. All of these capacitors are planar in nature for CMOS process compatibility and simplicity. The following references discuss such capacitors: "High Performance MIM Capacitor for RF BiCMOS/CMOS LSIs" by T. Yoshitomi et al, *IEEE Bipolar/BiCMOS Circuits and Technology Meetings*, paper #8.2, p. 133, 1999; "SOI CMOS With High-Performance Passive Components for Analog, RF, and Mixed-Signal Design", by M. Stuber et al, *Proceedings 1998 IEEE International SOI Conference*, p. 99–100, 1998; and "Integrated RF and Microwave Components in BiCMOS Technology", by J. N. Burghartz et al, *IEEE Trans. on Electron Devices*, V. 43, No. 9, p. 1559–1570, 1996. U.S. Pat. No. 5,998,264 to Wu discloses a MIM capacitor and U.S. Pat. No. 5,918,120 to Huang teaches a capacitor over bit line (COB) process.

Three-dimensional (3-D) MIM capacitors have also been used in advanced DRAM Technology. For example, see "Highly Reliable MIM Capacitor Technology Using Low Pressure CVD-WN Cylinder Storage-Node for 0.12 μm-scale Embedded DRAM", by S. Kamiyama et al, *Symposium on VLSI Technology*, paper #4A-4, p. 39–40, 1999, "A DRAM Technology Using MIM BST Capacitor for 0.15 μm DRAM Generation and Beyond", by K. Kim et al, *Symposium on VLSI Technology*, paper #4A-1, p. 33–34, 1999, and "Shared Tungsten Structures for FEOL/BEOL Compatibility in Logic-Friendly Merged DRAM" by J. M. Drynan et al, *IEDM* 1998, p. 31.6.1–4. The 3-D capacitors often have very small size, have a cylinder or crown shape, use high dielectric constant (k) dielectrics such as $Ta_2O_5$ or BST, and are fabricated by complicated DRAM processes. However, these 3-D MIM capacitors are usually fabricated below the first level of metal interconnect which leads to difficulty in merging DRAM and logic due to unmatched front-end and back-end layers. This fact also introduces critical issues including DRAM -logic height differences and high aspect ratio contacts. U.S. Pat. No. 6,117,725 to Huang teaches an embedded DRAM process where the capacitor is formed at the first level of metal interconnect.

In recent studies of embedded DRAM (that is, merging DRAM and logic circuits onto one chip), there have been suggestions to fabricate DRAM capacitors between the first and second levels of metal interconnect. See "Merged DRAM-Logic in the Year 2001" by P. W. Diodato et al, *IEEE Transactions*, 1998 and "A Simple Embedded DRAM Process for 0.16 μm CMOS Technologies" by C. T. Liu et al, *Symposium on VLSI Technology*, 2000, p. 60–61. However, the global topology between metal-1 and metal-2 results in different via depths. The capacitor height is also fixed in these proposals.

It is desired to provide a method for forming a vertical MIM capacitor for advanced DRAM applications that can be fabricated between any level of metal interconnect, depending on the desired depth of the capacitor, without global topology variation in any interconnect level.

SUMMARY OF THE INVENTION

Accordingly, it is a primary object of the invention to provide an effective and very manufacturable process for producing a metal-insulator-metal capacitor.

Another object of the present invention is to provide a method for fabricating a vertical metal-insulator-metal capacitor at any level of metal interconnect.

Yet another object of the present invention is to provide a method for fabricating a vertical metal-insulator-metal capacitor at any level of metal interconnect where there is no global topology variation in any interconnect level.

A further object is to provide a method for fabricating a vertical metal-insulator-metal capacitor where the process temperature is low enough so as not to damage or degrade back-end metal interconnects.

A still further object is to provide a method for fabricating a vertical metal-insulator-metal capacitor for embedded DRAM applications.

Yet another object of the invention is to provide a method for fabricating a vertical metal-insulator-metal capacitor for embedded DRAM or mixed-signal applications.

In accordance with the objects of this invention, a method for fabricating a vertical metal-insulator-metal capacitor is achieved. A plurality of contact plugs are formed through an insulating layer to semiconductor device structures in a semiconductor substrate wherein contact plugs are formed in a logic area of the semiconductor substrate and in a memory area of the semiconductor substrate. A plurality of metal lines and via plugs are formed through a plurality of insulating layers vertically contacting one another and contacting the contact plugs in the logic area wherein the insulating layers are also deposited vertically in the memory area. An oxide layer is deposited overlying the topmost of the metal lines and via plugs in the logic area and the topmost insulating layer in both the logic and memory areas. Openings are patterned through the oxide layer and the insulating layers in the memory area whereby a top portion of the contact plugs in the memory area is exposed. A first conducting layer is deposited conformally within the openings and contacting the exposed top portion of the contact plugs wherein the first conducting layer and the exposed contact plugs in the memory area together form a capacitor bottom plate electrode. The openings are partially filled with a protective layer and a top portion of the first conducting layer on upper sidewalls of the openings is etched back. The protective layer is removed. A capacitor dielectric layer is deposited overlying the first conducting layer. A second conducting layer is deposited overlying the capacitor dielectric layer. The second conducting layer and capacitor dielectric layer are removed except within the openings to complete formation of a vertical MIM capacitor in the fabrication of an integrated circuit device.

Also in accordance with the objects of this invention, another method for fabricating a vertical metal-insulator-metal capacitor is achieved. A plurality of contact plugs is formed through an insulating layer to semiconductor device structures in a semiconductor substrate wherein the contact plugs are formed in a logic area of the semiconductor substrate and in a memory area of the semiconductor substrate. A plurality of metal lines and via plugs are formed through a plurality of insulating layers vertically contacting one another and contacting the contact plugs in said both the logic area and the memory area. An oxide layer is deposited overlying the topmost of the metal lines and via plugs in both logic and memory areas. The oxide layer is removed where the capacitor is to be formed in the memory area. The plurality of metal lines and via plugs not covered by the oxide layer in the memory area are removed whereby openings are left exposing the contact plugs at the bottom of said openings in the memory area. A first conducting layer is deposited conformally within the openings contacting the exposed contact plugs wherein the first conducting layer and the exposed contact plugs in the memory area together form a capacitor bottom plate electrode. The openings are partially filled with a protective layer and a top portion of the first conducting layer on upper sidewalls of the openings is etched back. The protective layer is removed. A capacitor dielectric layer is deposited overlying the first conducting layer. A second conducting layer is deposited overlying the capacitor dielectric layer. The second conducting layer and the capacitor dielectric layer is removed except within the openings to complete formation of a vertical MIM capacitor in the fabrication of an integrated circuit device.

BRIEF DESCRIPTION OF THE DRAWINGS

In the following drawings forming a material part of this description, there is shown:

FIGS. 1 through 6 are schematic crosssectional representations of a first preferred embodiment of the present invention.

DESCRIPTION OF THE PREFERRED EMBODIMENTS

The process of the present invention provides methods for fabricating a vertical metal-insulator-metal (MIM) capacitor at any level of metal interconnect, depending upon the desired depth of the capacitor. No global topology variations occur at any interconnect level in these methods. The entire process temperature is limited to be low enough, less than about 450° C., so that the back-end metal interconnect is not degraded or damaged. Such 3-D MIM devices can be used for DRAM applications and also for mixed-signal applications. An embedded DRAM application is illustrated in the drawings. However, it should be understood that this invention is not limited to the embodiments shown in the figures, but can be applied and extended to other applications.

Hereinbelow are disclosed two fabrication methods for 3-D MIM capacitors. In one method, the deep capacitor cavity can be formed by etching back-end oxide (i.e. intermetal dielectric) from near the top level of metal interconnect until reaching the via-plug at several lower metal interconnect levels. In another method, metal lines and tungsten plugs are formed in both the logic and DRAM areas. Then, a selective wet metal etching is performed to remove the stacked tungsten plugs and metal lines for the formation of the capacitor cavity. After the capacitor cavity is formed by either method the sidewall of the deep cavity is coated sequentially with a conformal conducting film as the bottom electrode and a high-k dielectric, and then filled with a conducting material to form the top electrode. The first method will be described with reference to FIGS. 1–6 and the second method will be described with reference to FIGS. 7–10.

Figure 1:
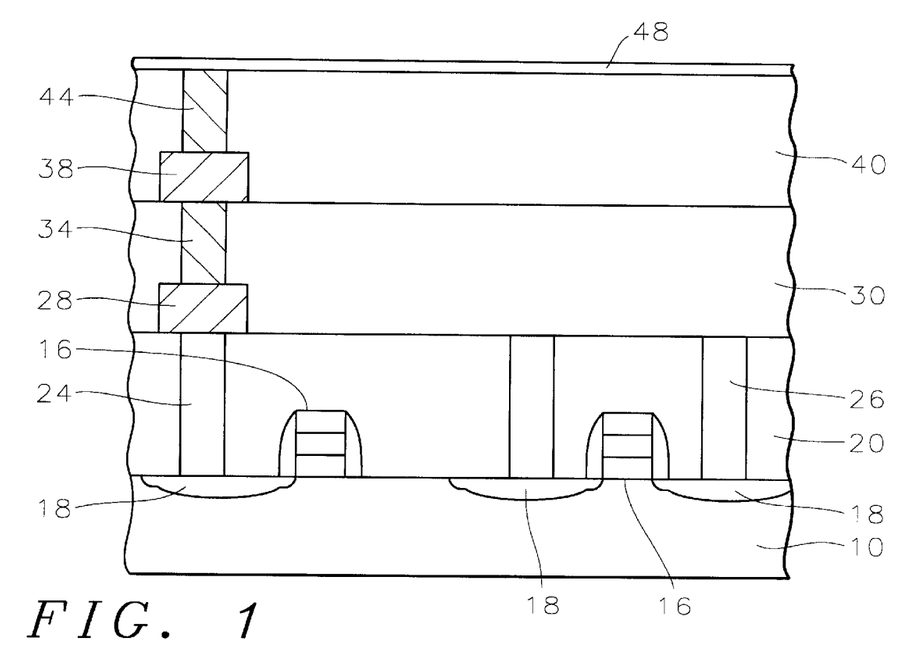

The first preferred embodiment of the present invention now will be described with reference to FIGS. 1–6. Referring now more particularly to FIG. 1, there is shown a partially completed integrated circuit device. The semiconductor substrate 10 is preferably composed of silicon having a (100) crystallographic orientation. Semiconductor device structures are formed in and on the semiconductor substrate. For example, gate electrodes 16 and associated source and drain regions 18 are formed in both the logic area L and the memory area M. A thick insulating layer, such as chemically vapor deposited (CVD) silicon dioxide, phosphosilicate glass (PSG), high density plasma oxide, or the like, 20 is deposited over the gate electrodes 16 and then planarized, for example by chemical mechanical polishing (CMP), to obtain a flat surface.

Using conventional lithographic and etching techniques, contact openings are made through the insulating layer 20 to the source and drain regions 18. The contact openings are filled with a conducting layer, such as tungsten or polysilicon (for refresh time improvement), for example, which is planarized by CMP or etchback to leave contact plugs 24 in the logic area L and contact plugs 26 in the memory area M. The contact plugs 26 will form the storage node contacts of the capacitor to be fabricated later.

Now, a metal-1 layer is deposited over the surface of the insulating layer 20 and the contact plugs 24 and 26. For example, the metal layer may comprise aluminum or an aluminum alloy such as AlCu or tungsten. The metal-1 layer is patterned to form first metal lines 28 in the logic area L.

A thick intermetal dielectric (IMD) layer 30, such as chemically vapor deposited (CVD) silicon dioxide, high density plasma oxide, or the like, is deposited over the metal-1 lines and planarized.

Using conventional lithographic and etching techniques, via-1 openings are made through the IMD layer 30 to the metal-1 lines in the logic area L. The via-1 openings are filled with a conducting layer, such as tungsten, titanium nitride/tungsten (TiN/W), or titanium/titanium nitride/tungsten (Ti/TiN/W), for example, which is planarized by CMP or etchback to leave via-1 plugs 34 in the logic area L.

Now, a metal-2 layer is deposited over the surface of the insulating layer 30 and the via-1 plugs 34. As for metal-1, the metal-2 layer may comprise aluminum or an aluminum alloy such as AlCu or tungsten. The metal-2 layer is patterned to form second metal lines 38 in the logic area L.

Additional IMD layers and via and metal levels may be fabricated in the logic area. For example, FIG. 1 illustrates IMD layer 40 and via-2 44. When the level is reached at which the capacitor is to be fabricated, a thin oxide layer 48 is deposited over the IMD layer and via plug, as shown. This oxide layer may be deposited by plasma-enhanced chemical vapor deposition (PE-CVD) to a thickness of between about 200 and 500 Angstroms.

Figure 2:
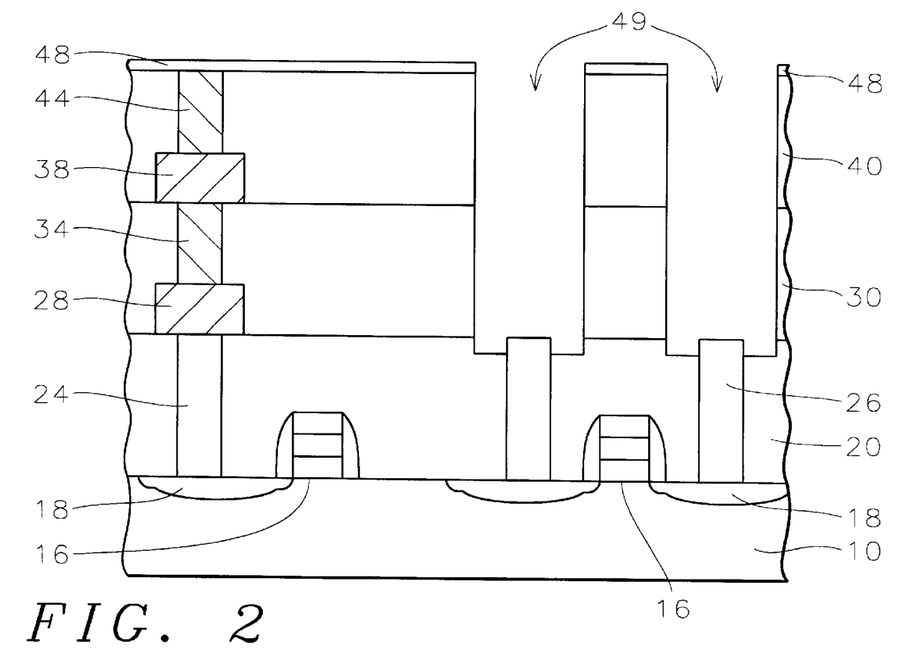

Referring now to FIG. 2, the cell storage node is patterned in the memory area M. The thin oxide layer 48 and the IMD layers 40 and 30 are etched through until the contact plug 26 is slightly exposed within the openings 49, as shown.

Figure 3A:
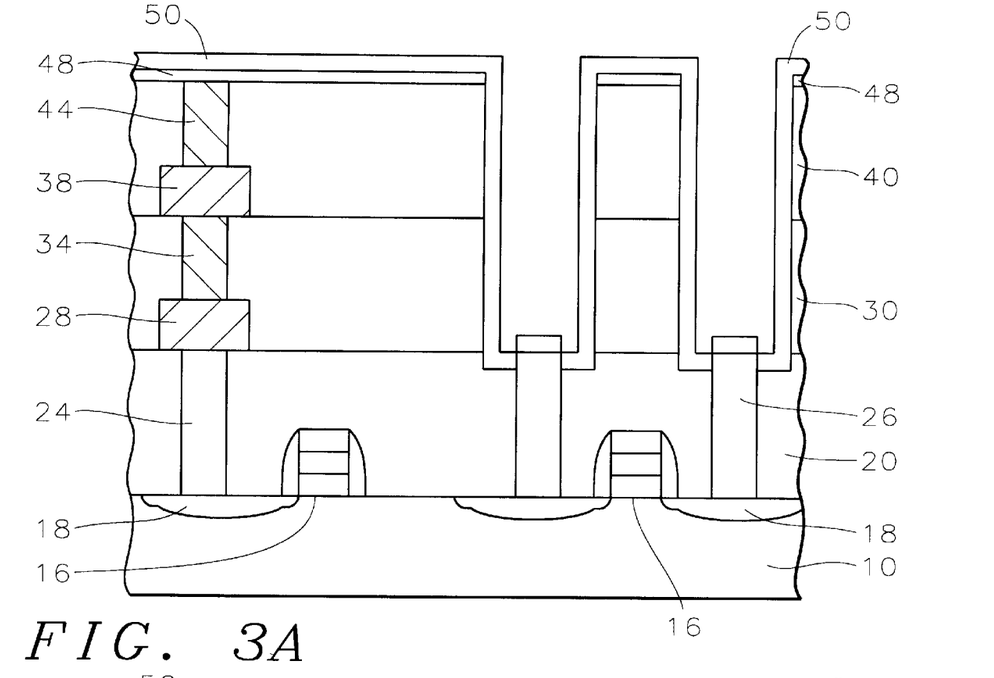
FIGS. 3A and 3B are schematic cross-sectional representations of two alternatives in a first preferred embodiment of the present invention.

Referring now to FIG. 3A, a thin conducting layer 50 is conformally deposited within the openings 49. The thin conducting layer may comprise titanium, titanium/titanium nitride, titanium nitride, tantalum nitride, tungsten, tungsten nitride, or the like. The thin conducting layer 50 is deposited by chemical vapor deposition (CVD) or sputtering methods at a low temperature of less than about 450° C. to a thickness of between about 200 and 500 Angstroms. The thin conducting layer 50 shorted to the exposed contact plug 26 serves as the bottom electrode of the capacitor.

This process also applies if there is a metal-1 line overlying the contact plug 26 for interconnection to other circuits. In this case, shown in FIG. 3B, the thin conducting layer 50 shorted to the metal-1 line 29 forms the bottom electrode of the capacitor. It will be understood that the process shown in the following figures can be applied to the alternative illustrated in FIG. 3B.

Figure 4:
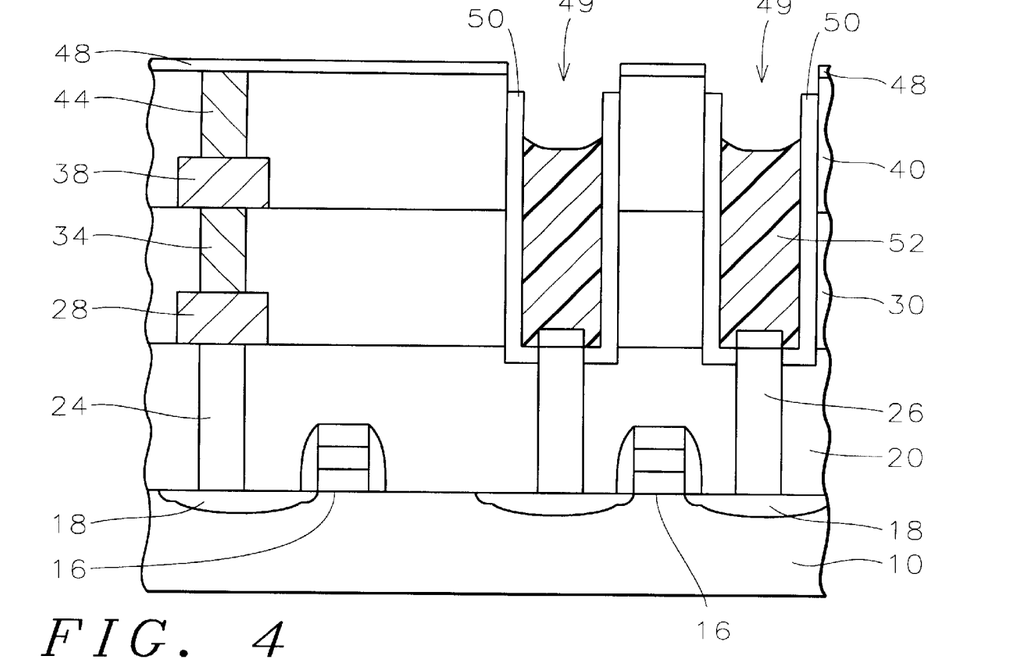

Referring now to FIG. 4, a spin-on photoresist or anti-reflective coating (BARC) layer 52 is coated over the thin conducting layer 50 and partially etched back or partially exposed and developed away to leave the coating 52 only within the capacitor cavity 49.

Now, a slow etch back of the capacitor electrode material 50 is applied to remove the electrode material on the top surface of the oxide layer 48 and also to slightly recess the top electrode 50, about 2000 to 3000 Angstroms along the edge of the capacitor cavity 49 below the top surface. The oxide layer 48 protects the underlying via-2 44 during this etch back.

Figure 5:
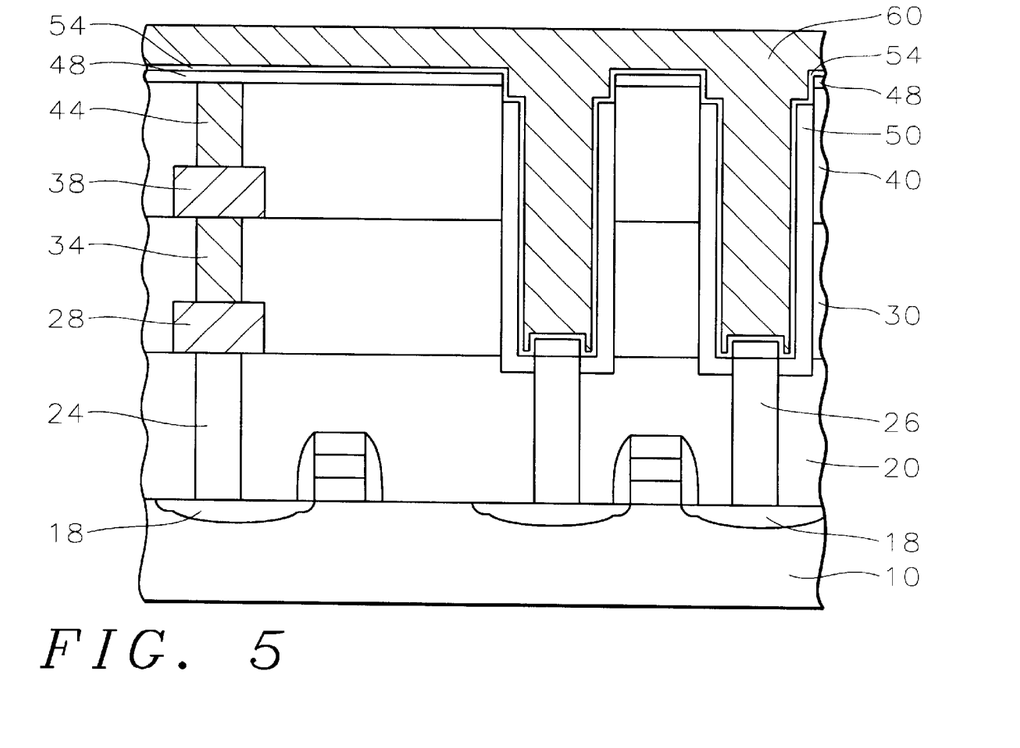

The protective coating 52 is stripped away. Now, the capacitor dielectric layer is to be formed. A thin high-k dielectric layer 54 is conformally deposited overlying the oxide layer 48 and within the capacitor cavity 49. This layer 54 may comprise $Ta_2O_5$, BST, PZT, or other high-k materials. The capacitor dielectric layer is deposited by CVD to a thickness of between about 60 and 150 Angstroms at below about 450° C.

A second conducting layer 60 is deposited at below about 450° C. over the capacitor dielectric layer 54 and filling the capacitor cavity. This conducting layer 60 will form the top electrode of the capacitor. The top electrode layer comprises titanium nitride, tantalum nitride, tungsten, tungsten nitride, or the like.

Now, the conducting layer 60 is planarized using CMP, for example, to leave the conducting layer 60 only within the capacitor cavity. The conducting layer 60, capacitor dielectric layer 54, and thin oxide layer 48 are removed overlying the topmost intermetal dielectric layer 40 and the via-2 plug 44 in the logic area L. It is important to note that the bottom capacitor electrode 50 is not exposed during this polishing step since it has been recessed within the capacitor cavity 2000 to 3000 Angstroms below the top surface of the via-2 plug.

Figure 3B:
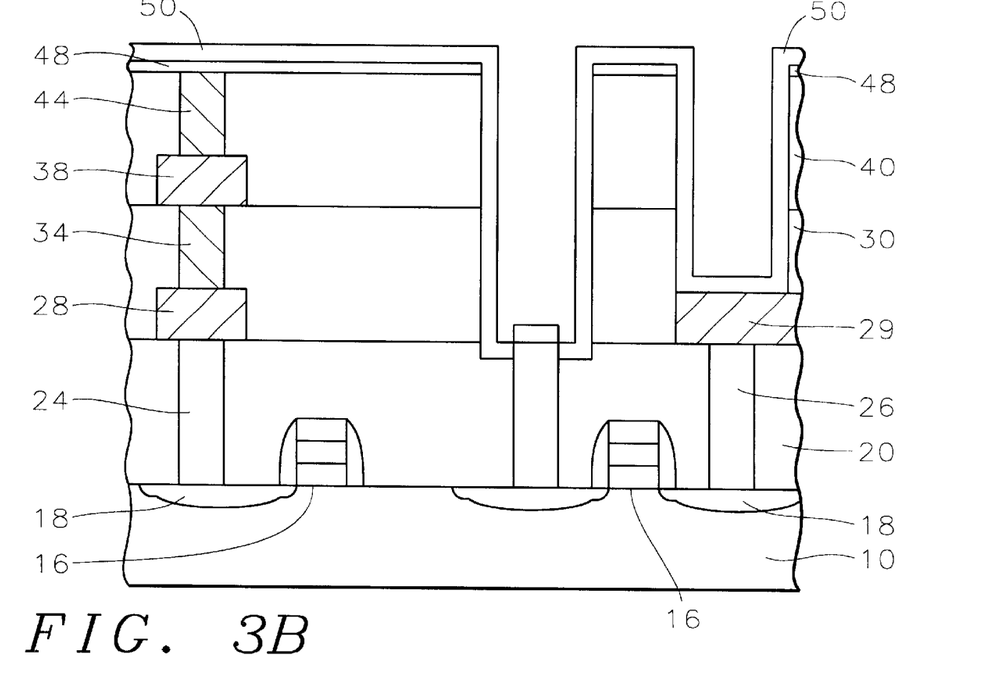
Figure 6:
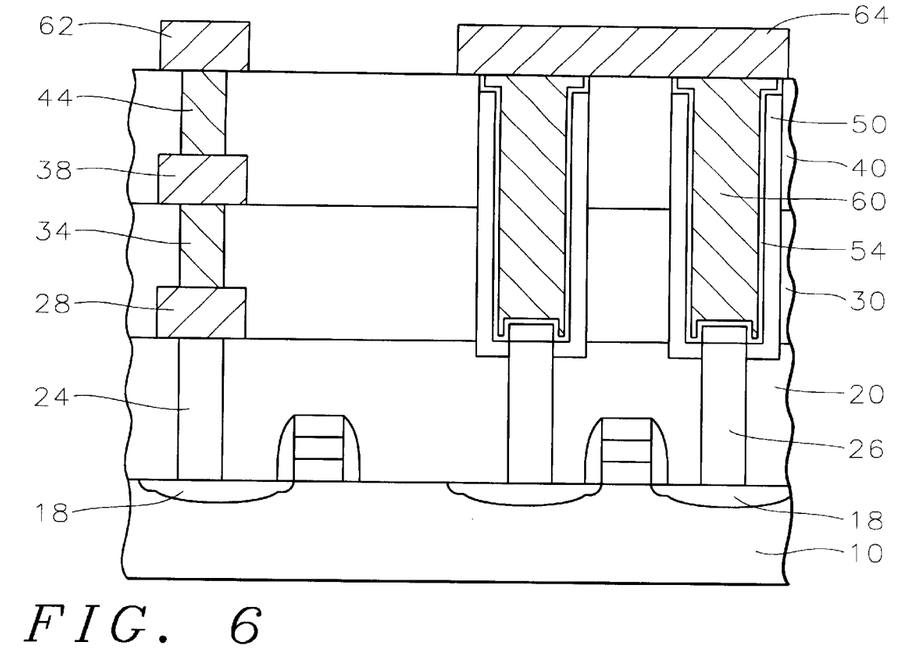

Referring now to FIG. 6, another metal layer is deposited and patterned to form metal-3 lines 62 in the logic area L and 64 in the memory area M. Conventional back-end processing continues. It should be noted that the capacitor height can vary from that shown in the figures. For example, the capacitor could be formed after via-1, after via-2 (as in the example illustrated), after metal-1 (as shown in FIG. 3B), or after via-3, and so on.

Figure 7:
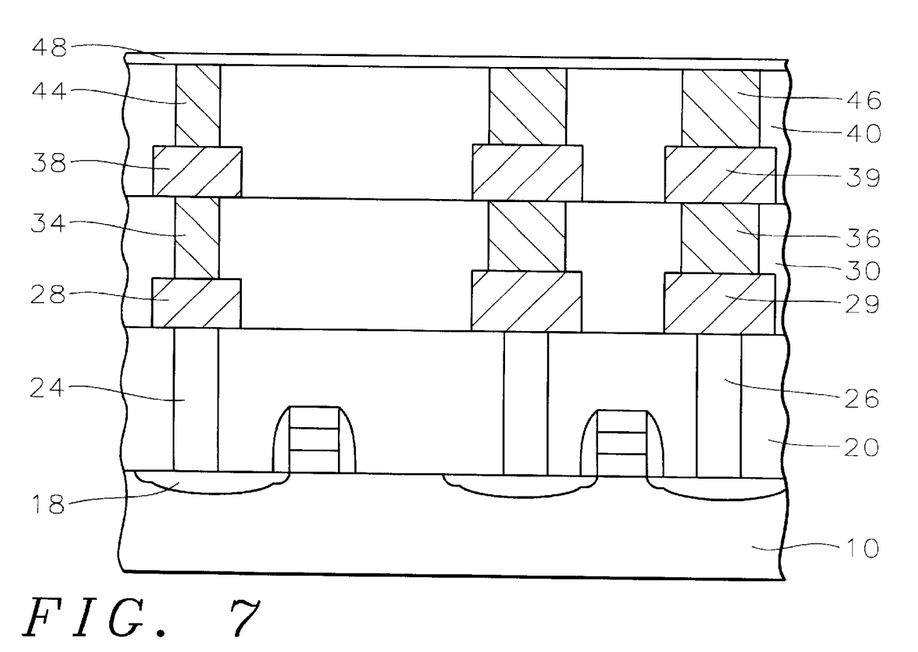
FIGS. 7 through 10 are schematic crosssectional representations of a second preferred embodiment of the present invention.

The second preferred embodiment of the present invention now will be described with reference to FIGS. 7–10. Referring now more particularly to FIG. 7, there is shown a partially completed integrated circuit device. The semiconductor substrate 10 is preferably composed of silicon having a (100) crystallographic orientation. Semiconductor device structures are formed in and on the semiconductor substrate.

For example, gate electrodes 16 and associated source and drain regions 18 are formed in both the logic area L and the memory area M. A thick insulating layer, such as chemically vapor deposited (CVD) silicon dioxide, phosphosilicate glass (PSG), high density plasma oxide, or the like, 20 is deposited over the gate electrodes 16 and then planarized, for example by chemical mechanical polishing (CMP), to obtain a flat surface.

Using conventional lithographic and etching techniques, contact openings are made through the insulating layer 20 to the source and drain regions 18. The contact openings are filled with a conducting layer, such as tungsten or polysilicon (for refresh time improvement), for example, which is planarized by CMP or etchback to leave contact plugs 24 in the logic area L and contact plugs 26 in the memory area M. The contact plugs 26 will form the storage node contacts of the capacitor to be fabricated later.

Now, in this embodiment, via plugs and metal lines will be formed in both the logic area L and the memory area M in the same way. A metal-1 layer is deposited over the surface of the insulating layer 20 and the contact plugs 24 and 26. For example, the metal layer may comprise aluminum, an aluminum alloy such as AlCu, or tungsten. The metal-1 layer is patterned to form first metal lines 28 in the logic area L and 29 in the memory area M.

A thick intermetal dielectric (IMD) layer 30, such as chemically vapor deposited (CVD) silicon dioxide, high density plasma oxide, or the like, is deposited over the metal-1 lines and planarized.

Using conventional lithographic and etching techniques, via-1 openings are made through the IMD layer 30 to the metal-1 lines. The via-1 openings are filled with a conducting layer, such as TiN/W or Ti/TiN/W, for example, which is planarized by CMP or etchback to leave via-1 plugs 34 in the logic area L and 36 in the memory area M.

Now, a metal-2 layer is deposited over the surface of the insulating layer 30 and the via-1 plugs 34 and 36. As for metal-1, the metal-2 layer may comprise aluminum, an aluminum alloy such as AlCu, or tungsten. The metal-2 layer is patterned to form second metal lines 38 in the logic area L and 39 in the memory area M.

Additional IMD layers and via and metal levels may be fabricated in the logic area. For example, FIG. 7 illustrates IMD layer 40 and via-2 44 and 46. When the level is reached at which the capacitor is to be fabricated, a thin oxide layer 48 is deposited over the IMD layer and via plugs, as shown. This oxide layer may be deposited by PE-CVD to a thickness of between about 200 and 500 Angstroms.

Figure 8:
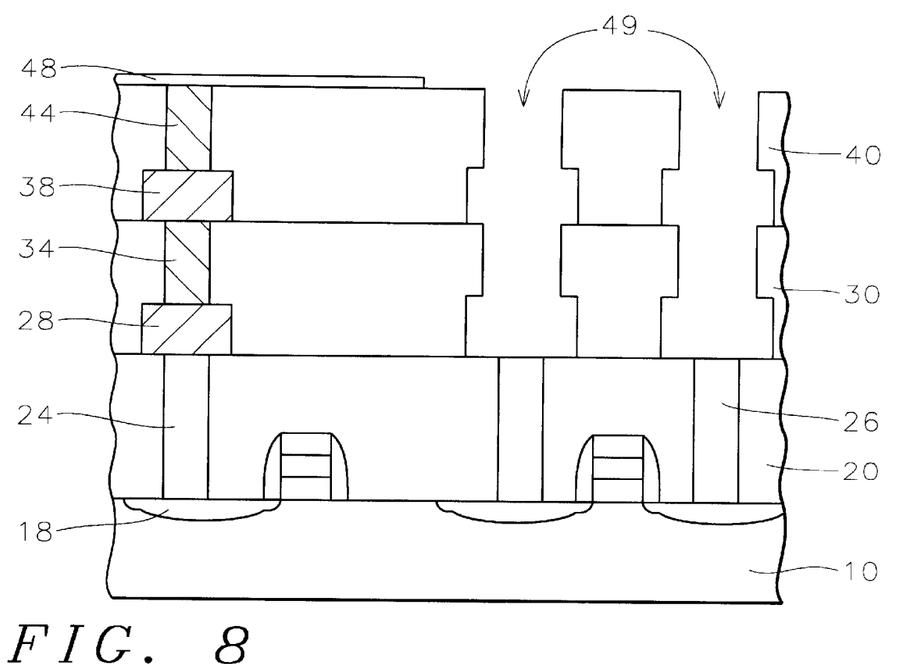

Referring now to FIG. 8, the capacitor node area is exposed by a masking step, not shown. Now, the thin oxide layer 48 in the capacitor mode area is etched away to expose the via-2 plugs 46 in the memory area M. After the mask, not shown, is removed, all the metal materials in the via plugs and metal lines in the memory area are removed, leaving openings 49. Wet metal etching is preferably used to remove the metal materials. For example, $H_2O_2$ may be used to remove tungsten and $CH_3COOH:HNO_3:H_3PO_4:H_2O$ may be used to remove aluminum.

In a preferred way, as illustrated in FIG. 8, the node contact 26 comprises polysilicon. In this way, the metal etch is stopped at the polysilicon contact plug 26 to better preserve integrity of the node junctions in the cell area. If the contact plug 26 is tungsten, the metal-1 line 29 will be preferably aluminum. The $CH_3COOH:HNO_3:H_3PO_4:H_2O$ mixture used to remove the metal-1 line will not affect the tungsten plug.

Figure 9:
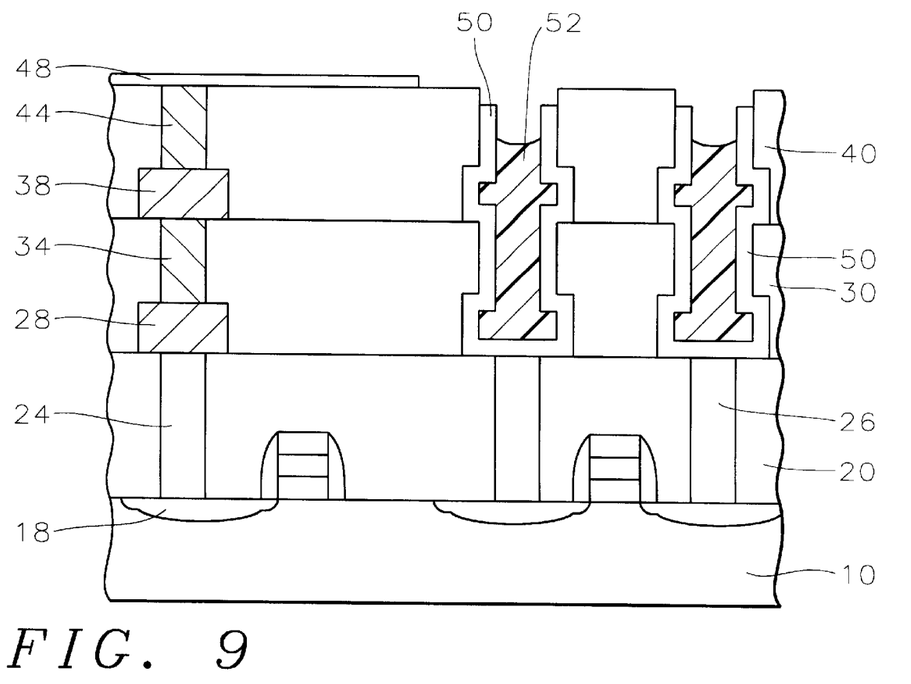

Referring now to FIG. 9, a thin conducting layer 50 is conformally deposited within the openings 49. The thin conducting layer may comprise titanium, titanium/titanium nitride, titanium nitride, tantalum nitride, tungsten, tungsten nitride, or the like. The thin conducting layer 50 is deposited by chemical vapor deposition (CVD) for good conformity (and not by sputtering) at a low temperature of less than about 450° C. to a thickness of between about 200 and 500 Angstroms. The thin conducting layer 50 shorted to the exposed contact plug 26 serves as the bottom electrode of the capacitor.

A spin-on photoresist or anti-reflective coating (BARC) layer 52 is coated over the thin conducting layer 50 and partially etched back or partially exposed and developed away to leave the coating 52 only within the capacitor cavity 49, but not on the top surface.

Now, a slow etch back of the capacitor electrode material 50 is applied to remove the electrode material from the top surfaces and to slightly recess the top electrode 50, about 2000 to 3000 Angstroms along the edge of the capacitor cavity 49 below the top surface. This step provides necessary isolation between the capacitor cavities as well as between the bottom electrode and the to-be-deposited top electrode. The oxide layer 48 protects the underlying via-2 44 in the logic area L during this etch back.

Figure 10:
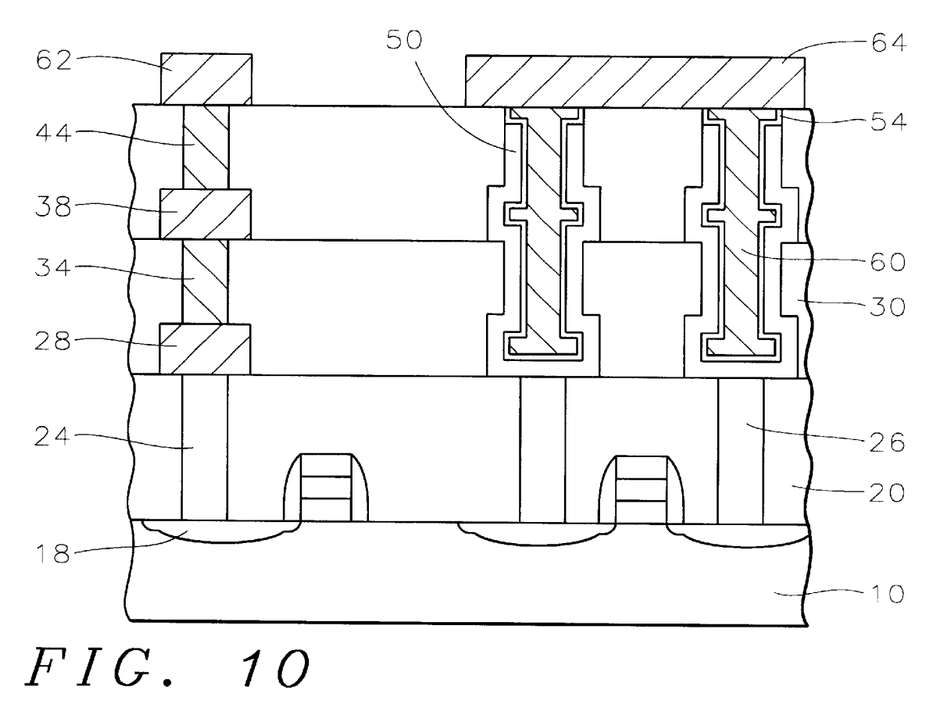

Now, the protection coating 52 is stripped away. Now, the capacitor dielectric layer is to be formed, as shown in FIG. 10. A thin high-k dielectric layer 54 is conformally deposited overlying the oxide layer 48 and within the capacitor cavity 49 at a temperature of below about 450° C. This layer 54 may comprise $Ta_2O_5$, BST, PZT, or other high-k materials. The capacitor dielectric layer is deposited by CVD for low process temperature and good conformity to a thickness of between about 60 and 150 Angstroms.

A second conducting layer 60 is deposited over the capacitor dielectric layer 54 and filling the capacitor cavity at a temperature of below about 450° C . This conducting layer 60 will form the top electrode of the capacitor. The top electrode layer comprises titanium nitride, tantalum nitride, tungsten, tungsten nitride, or the like.

Now, the conducting layer 60 is planarized using CMP, for example, to leave the conducting layer 60 only within the capacitor cavities. The conducting layer 60, capacitor dielectric layer 54, and thin oxide layer 48 are removed overlying the topmost intermetal dielectric layer 40 and the via-2 plug 44 in the logic area L. It is important to note that the bottom capacitor electrode 50 is isolated from the top electrode because it has been recessed within the capacitor cavity 2000 to 3000 Angstroms below the top surface of the via-2 plug.

Another metal layer is deposited and patterned to form metal-3 lines 62 in the logic area L and 64 in the memory area M. Conventional back-end processing continues. It should be noted that the capacitor height can vary from that shown in the figures. For example, the capacitor could be formed after via-1, after via-2 (as in the example illustrated), or after via-3, and so on.

The process of the present invention provides two methods of fabricating a 3-D vertical MIM capacitor at any level of metal interconnect, depending upon the desired depth of the capacitor. No global topology variations occur at any interconnect level in these methods. The entire process temperature is limited to be low enough, less than about 450° C., so that the back-end metal interconnect is not degraded or damaged. Such 3-D MIM devices can be used for DRAM applications and also for mixed-signal applications.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a capacitor comprising:

providing a plurality of contact plugs through an insulating layer to semiconductor device structures in a substrate wherein said contact plugs are formed in a logic area of said substrate and in a memory area of said substrate;

forming a plurality of metal lines and via plugs through a plurality of insulating layers vertically contacting one another and contacting said contact plugs in said logic area wherein said insulating layers are also deposited vertically in said memory area;

depositing an oxide layer overlying topmost of said metal lines and via plugs in said logic area and topmost of said insulating layers in both said logic area and said memory area;

patterning openings through said oxide layer and said plurality of insulating layers in said memory area whereby a top portion of said contact plugs in said memory area is exposed;

depositing a first conducting layer conformally within said openings and contacting said exposed top portion of said contact plugs wherein said first conducting layer and said exposed said contact plugs in said memory area together form a capacitor bottom plate electrode;

thereafter partially filling said openings with a protective layer and etching back a top portion of said first conducting layer on upper sidewalls of said openings 2000 to 3000 Angstroms;

removing said protective layer;

thereafter depositing a capacitor dielectric layer overlying said first conducting layer;

depositing a second conducting layer overlying said capacitor dielectric layer; and removing said second conducting layer and said capacitor dielectric layer except within said openings to complete formation of said capacitor in the fabrication of said integrated circuit device.

2. The method according to claim 1 wherein said capacitor dielectric layer comprises a high dielectric constant material and has a thickness of between about 60 and 150 Angstroms.

3. The method according to claim 1 wherein said capacitor dielectric layer comprises: tantalum oxide ($Ta_2O_5$), BST, or PZT.

4. The method according to claim 1 wherein said second conducting layer comprises: titanium, titanium/titanium nitride, titanium nitride, tantalum nitride, tungsten, or tungsten nitride and wherein said second conducting layer has a thickness of between about 500 and 2000 Angstroms.

5. The method according to claim 1 further comprising depositing a metal layer overlying said capacitor in said memory area and said topmost metal lines or via plugs in said logic area and patterning said metal layer to form metal lines in said memory area and in said logic area.

6. A method for fabricating a capacitor comprising:

providing a plurality of contact plugs through an. insulating layer to semiconductor device structures in a substrate wherein said contact plugs are formed in a logic area of said substrate and in a memory area of said substrate;

forming a plurality of metal lines and via plugs through a plurality of insulating layers vertically contacting one another and contacting said contact plugs in both said logic area and said memory area;

depositing an oxide layer overlying topmost of said metal lines and via plugs in both said logic area and said memory area;

removing said oxide layer where said capacitor is to be formed in said memory area;

removing said plurality of metal lines and via plugs not covered by said oxide layer in said memory area whereby openings are left exposing said contact plugs at the bottom of said openings in said memory area;

depositing a first conducting layer conformally within said openings and contacting said exposed contact plugs wherein said first conducting layer and said exposed said contact plugs in said memory area together form a capacitor bottom plate electrode;

thereafter partially filling said openings with a protective layer and etching back a top portion of said first conducting layer on upper sidewalls of said openings;

removing said protective layer;

thereafter depositing a capacitor dielectric layer overlying said first conducting layer;

depositing a second conducting layer overlying said capacitor dielectric layer; and removing said second conducting layer and said capacitor dielectric layer except within said openings to complete formation of said capacitor in the fabrication of said integrated circuit device.

7. The method according to claim 6 wherein said semiconductor structures include source and drain regions.

8. The method according to claim 6 wherein said contact plugs are selected from the group containing tungsten and polysilicon.

9. The method according to claim 6 wherein said metal lines and via plugs are selected from the group containing: tungsten via plugs, aluminum lines, and tungsten lines.

10. The method according to claim 6 wherein said oxide layer comprises silicon oxide having a thickness of between about 200 and 500 Angstroms.

11. The method according to claim 6 wherein said first conducting layer is selected from the group containing: titanium, titanium/titanium nitride, titanium nitride, tantalum nitride, tungsten, and tungsten nitride and wherein said first conducting layer has a thickness of between about 200 and 500 Angstroms.

12. The method according to claim 6 wherein said all of said depositing steps are performed at a temperature of less than 450° C.

13. The method according to claim 6 wherein said protective layer is selected from the group containing: photoresist and organic anti-reflective coating material.

14. The method according to claim 6 further comprising partially etching back said protective layer to leave said protective layer only within said openings and not filling said openings.

15. The method according to claim 6 further comprising exposing and partially developing away said protective layer to leave said protective layer only within said openings and not filling said openings.

16. The method according to claim 6 wherein said top portion of said first conducting layer on upper sidewalls of said openings is etched back 2000 to 3000 Angstroms.

17. The method according to claim 6 wherein said capacitor dielectric layer comprises a high dielectric constant material and has a thickness of between about 60 and 150 Angstroms.

18. The method according to claim 6 wherein said capacitor dielectric layer is selected from the group containing: tantalum oxide ($Ta_2O_5$), BST, and PZT.

19. The method according to claim 6 wherein said second conducting layer is selected from the group containing: titanium, titanium/titanium nitride, titanium nitride, tantalum nitride, tungsten, and tungsten nitride and wherein said second conducting layer has a thickness of between about 500 and 2000 Angstroms.

20. The method according to claim 6 further comprising depositing a metal layer overlying said capacitor in said memory area and said topmost metal lines or via plugs in said logic area and patterning said metal layer to form metal lines in said memory area and in said logic area.

21. A method for fabricating a vertical metal-insulator-metal capacitor comprising:

providing a plurality of contact plugs through an insulating layer to semiconductor device structures in a substrate wherein said contact plugs are formed in a logic area of said substrate and in a memory area of said substrate;

forming a plurality of metal lines and via plugs through a plurality of insulating layers vertically contacting one another and contacting said contact plugs in said logic area wherein said insulating layers are also deposited vertically in said memory area;

depositing an oxide layer overlying topmost of said metal lines and via plugs in said logic area and topmost of said insulating layers in both said logic area and said memory area;

patterning openings through said oxide layer and said plurality of insulating layers in said memory area whereby a top portion of said contact plugs in said memory area is exposed;

depositing a first conducting layer conformally within said openings and contacting said exposed top portion of said contact plugs wherein said first conducting layer and said exposed said contact plugs in said memory area together form a capacitor bottom plate electrode and wherein said depositing is performed at a temperature less than 450° C.;

thereafter partially filling said openings with a protective layer and etching back a top portion of said first conducting layer on upper sidewalls of said openings 2000 to 3000 Angstroms;

removing said protective layer;

thereafter depositing a capacitor dielectric layer overlying said first conducting layer wherein said depositing is performed at a temperature less than 450° C.;

depositing a second conducting layer overlying said capacitor dielectric layer wherein said depositing is performed at a temperature less than 450° C.; and removing said second conducting layer and said capacitor dielectric layer except within said openings to complete formation of said capacitor in the fabrication of said integrated circuit device.

22. The method according to claim 21 wherein said capacitor dielectric layer comprises a high dielectric constant material comprising $Ta_2O_5$, BST, or PZT and has a thickness of between about 60 and 150 Angstroms.

23. The method according to claim 21 further comprising forming further levels of metal lines and via plugs in both said logic area and said memory area.

24. A method for fabricating a vertical metal-insulator-metal capacitor comprising:

providing a plurality of contact plugs through an insulating layer to semiconductor device structures in a substrate wherein said contact plugs are formed in a logic area of said substrate and in a memory area of said substrate;

forming a plurality of metal lines and via plugs through a plurality of insulating layers vertically contacting one another and contacting said contact plugs in said both said logic area and said memory area;

depositing an oxide layer overlying topmost of said metal lines and via plugs in both said logic area and said memory area;

removing said oxide layer where said capacitor is to be formed in said memory area;

removing said plurality of metal lines and via plugs not covered by said oxide layer in said memory area whereby openings are left exposing said contact plugs at the bottom of said openings in said memory area;

depositing a first conducting layer conformally within said openings and contacting said exposed contact plugs wherein said first conducting layer and said exposed said contact plugs in said memory area together form a capacitor bottom plate electrode and wherein said depositing is performed at a temperature less than 450° C.;

thereafter partially filling said openings with a protective layer and etching back a top portion of said first conducting layer on upper sidewalls of said openings;

removing said protective layer;

thereafter depositing a capacitor dielectric layer overlying said first conducting layer wherein said depositing is performed at a temperature less than 450° C.;

depositing a second conducting layer overlying said capacitor dielectric layer wherein said depositing is performed at a temperature less than 450° C.; and removing said second conducting layer and said capacitor dielectric layer except within said openings to complete formation of said capacitor in the fabrication of said integrated circuit device.

25. The method according to claim 24 wherein said contact plugs are selected from the group containing tungsten and polysilicon.

26. The method according to claim 24 wherein said metal lines and via plugs are selected from the group containing: tungsten via plugs, aluminum lines, and tungsten lines and wherein any level of metal lines or via plug can comprise said topmost level where said capacitor is formed.

27. The method according to claim 24 wherein said oxide layer comprises silicon oxide having a thickness of between about 200 and 500 Angstroms.

28. The method according to claim 24 wherein said first and second conducting layers are selected from the group containing: titanium, titanium/titanium nitride, titanium nitride, tantalum nitride, tungsten, and tungsten nitride and wherein said first conducting layer has a thickness of between about 200 and 500 Angstroms.

29. The method according to claim 24 wherein said protective layer is selected from the group containing: photoresist and organic anti-reflective coating material.

30. The method according to claim 24 further comprising partially etching back said protective layer to leave said protective layer only within said openings and not filling said openings.

31. The method according to claim 24 further comprising exposing and partially developing away said protective layer to leave said protective layer only within said openings and not filling said openings.

32. The method according to claim 24 wherein said top portion of said first conducting layer on upper sidewalls of said openings is etched back 2000 to 3000 Angstroms.

33. The method according to claim 24 wherein said capacitor dielectric layer comprises a high dielectric constant material selected from the group containing $Ta_2O_5$, BST, and PZT and has a thickness of between about 60 and 150 Angstroms.

34. The method according to claim 24 further comprising forming further levels of metal lines and via plugs in both said logic area and said memory area.

35. The method according to claim 1 wherein said semiconductor structures include source and drain regions.

36. The method according to claim 1 wherein said contact plugs comprise tungsten or polysilicon.

37. The method according to claim 1 wherein said metal lines and via plugs comprise tungsten via plugs, aluminum lines, or tungsten lines.

38. The method according to claim 1 wherein said oxide layer comprises silicon oxide having a thickness of between about 200 and 500 Angstroms.

39. The method according to claim 1 wherein said first conducting layer comprises titanium, titanium/titanium nitride, titanium nitride, tantalum nitride, tungsten, or tungsten nitride and wherein said first conducting layer has a thickness of between about 200 and 500 Angstroms.

40. The method according to claim 1 wherein said all of said depositing steps are performed at a temperature of less than 450° C.

41. The method according to claim 1 wherein said protective layer comprises photoresist or organic anti-reflective coating material.

42. The method according to claim 1 further comprising partially etching back said protective layer to leave said protective layer only within said openings and not filling said openings.

43. The method according to claim 1 further comprising exposing and partially developing away said protective layer to leave said protective layer only within said openings and not filling said openings.

44. The method according to claim 21 wherein said contact plugs comprise tungsten or polysilicon.

45. The method according to claim 21 wherein said metal lines and via plugs comprise tungsten via plugs, aluminum lines, or tungsten lines wherein any level of metal lines or via plug can comprise said topmost level where said capacitor is formed.

46. The method according to claim 21 wherein said oxide layer comprises silicon oxide having a thickness of between about 200 and 500 Angstroms.

47. The method according to claim 21 wherein said first and second conducting layers comprise titanium, titanium/titanium nitride, titanium nitride, tantalum nitride, tungsten, or tungsten nitride and wherein said first conducting layer has a thickness of between about 200 and 500 Angstroms.

48. The method according to claim 21 wherein said protective layer comprises photoresist or organic anti-reflective coating material.

49. The method according to claim 21 further comprising partially etching back said protective layer to leave said protective layer only within said openings and not filling said openings.

50. The method according to claim 21 further comprising exposing and partially developing away said protective layer to leave said protective layer only within said openings and not filling said openings.

* * * * *

UNITED STATES PATENT AND TRADEMARK OFFICE
CERTIFICATE OF CORRECTION

| | | |
|---|---|---|
| PATENT NO. | : 6,528,366 B1 | |
| DATED | : March 4, 2003 | |
| INVENTOR(S) | : Yeur-Luen Tu, Dah Cheng Lin and Min-Hwa Chi | |

It is certified that error appears in the above-identified patent and that said Letters Patent is hereby corrected as shown below:

<u>Title page,</u>
Item [75], please delete "Dah Lin", and replace with -- Dah Cheng Lin --.

Signed and Sealed this

Fifth Day of August, 2003

JAMES E. ROGAN
*Director of the United States Patent and Trademark Office*